United States Patent
Jouin et al.

(10) Patent No.: US 8,629,796 B1
(45) Date of Patent: Jan. 14, 2014

(54) PREVENTING INTERFERENCE BETWEEN MICROCONTROLLER COMPONENTS

(75) Inventors: Sebastien Jouin, La Chapelle Launay (FR); Romain Oddoart, Petit Mars (FR); Mickael Le Dily, Carquefou (FR); Jerome Poidevin, Carquefou (FR)

(73) Assignee: Atmel Corporation, San Jose, CA (US)

( * ) Notice: Subject to any disclaimer, the term of this patent is extended or adjusted under 35 U.S.C. 154(b) by 0 days.

(21) Appl. No.: 13/597,939

(22) Filed: Aug. 29, 2012

Related U.S. Application Data

(60) Provisional application No. 61/676,605, filed on Jul. 27, 2012.

(51) Int. Cl.
  *H03M 1/12* (2006.01)
(52) U.S. Cl.
  USPC ............................................. 341/155; 455/1

(58) Field of Classification Search
  USPC ........ 341/141, 155, 118; 713/323, 501; 455/1
  See application file for complete search history.

(56) References Cited

U.S. PATENT DOCUMENTS

| | | | |
|---|---|---|---|
| 6,973,025 B2* | 12/2005 | Koo | 370/217 |
| 8,139,327 B2* | 3/2012 | Ito et al. | 361/18 |
| 8,199,687 B2* | 6/2012 | Okada | 370/311 |
| 2009/0251205 A1* | 10/2009 | Lin | 327/544 |

* cited by examiner

*Primary Examiner* — Peguy Jean Pierre
(74) *Attorney, Agent, or Firm* — Fish & Richardson P.C.

(57) ABSTRACT

A microcontroller includes first and second modules. The first module can operate in a mode that causes interference with operation of the second module. A control circuit on the first module and a control circuit on the second module coordinate operation of the first and second modules to prevent the interference from causing the second module to function incorrectly.

20 Claims, 5 Drawing Sheets

PREVENTING INTERFERENCE BETWEEN MICROCONTROLLER COMPONENTS

CROSS-REFERENCE TO RELATED APPLICATIONS

This application claims the benefit and priority of U.S. Provisional Application Ser. No. 61/676,605, filed Jul. 27, 2012, the entire contents of which are hereby incorporated by reference.

TECHNICAL FIELD

This disclosure relates generally to electronics and more particularly to microcontrollers.

BACKGROUND

Designers of microcontroller chips face a variety of challenges. Several of these challenges include chip layout, size, power, and interference. Minimizing chip size can improve production yield but requires components to be placed closer together. When components are placed near one another, one of the components can cause interference with other components. In addition, chip designers generally prefer to minimize power consumption of chips.

SUMMARY

A microcontroller includes first and second modules. The first module can operate in a mode that causes interference with operation of the second module. A control circuit on the first module and a control circuit on the second module coordinate operation of the first and second modules to prevent the interference from causing the second module to function incorrectly.

Particular implementations can provide one or more of the following advantages: 1) the first and second modules do not cause interference with each other; 2) designers can locate the first and second modules more closely together than would have otherwise been practical in some conventional systems; 3) the microcontroller can save power by operating the modules in lower power modes; and 4) designers can use components that cause more interference, e.g., a more power-efficient component that causes more interference.

The details of one or more embodiments of the invention are set forth in the accompanying drawings and the description below. Other features, objects, and advantages of the invention will be apparent from the description and drawings, and from the claims.

DESCRIPTION OF DRAWINGS

Like reference symbols in the various drawings indicate like elements.

DETAILED DESCRIPTION

Example Microcontroller

Figure 1:
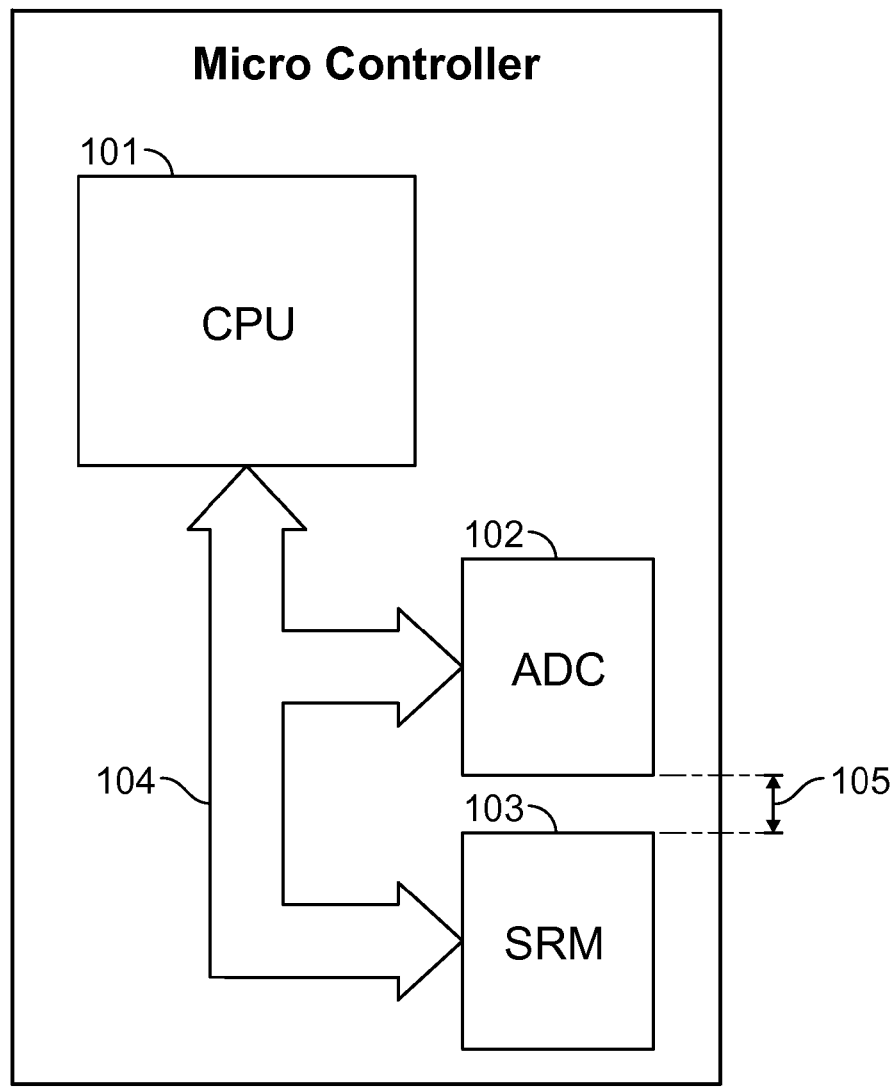
FIG. 1 is an example of a microcontroller showing the relative placement of several components.

FIG. 1 shows an example microcontroller 100. The microcontroller includes a central processing unit (CPU) 101, an analog to digital converter (ADC) 102, and switching regulator module (SRM) 103 that are coupled together with a bus 104. The ADC and SRM are separated by a distance 105. The distance can be small, e.g., so that the ADC is susceptible to interference from operation of the SRM.

The ADC converts analog information into digital information, e.g., so that the CPU can process it. The SRM regulates power or voltage signals to components in the chip. However, individual operation of any one component can generate electromagnetic interference. The effect of such interference can decrease as distance increases. Hence, components located close to each other risk interference while both components are simultaneously operational.

Due to physical constraints, designers sometimes place components very close to one another, subjecting at least one component to interference from another. In this example, the ADC conversion operation is sensitive to interference, and the switching regulator module generates interference. In some implementations, the ADC and the SRM are separated by a distance of 200 microns, or 400 microns, or 800 microns.

Example Timing Diagram

Figure 2:
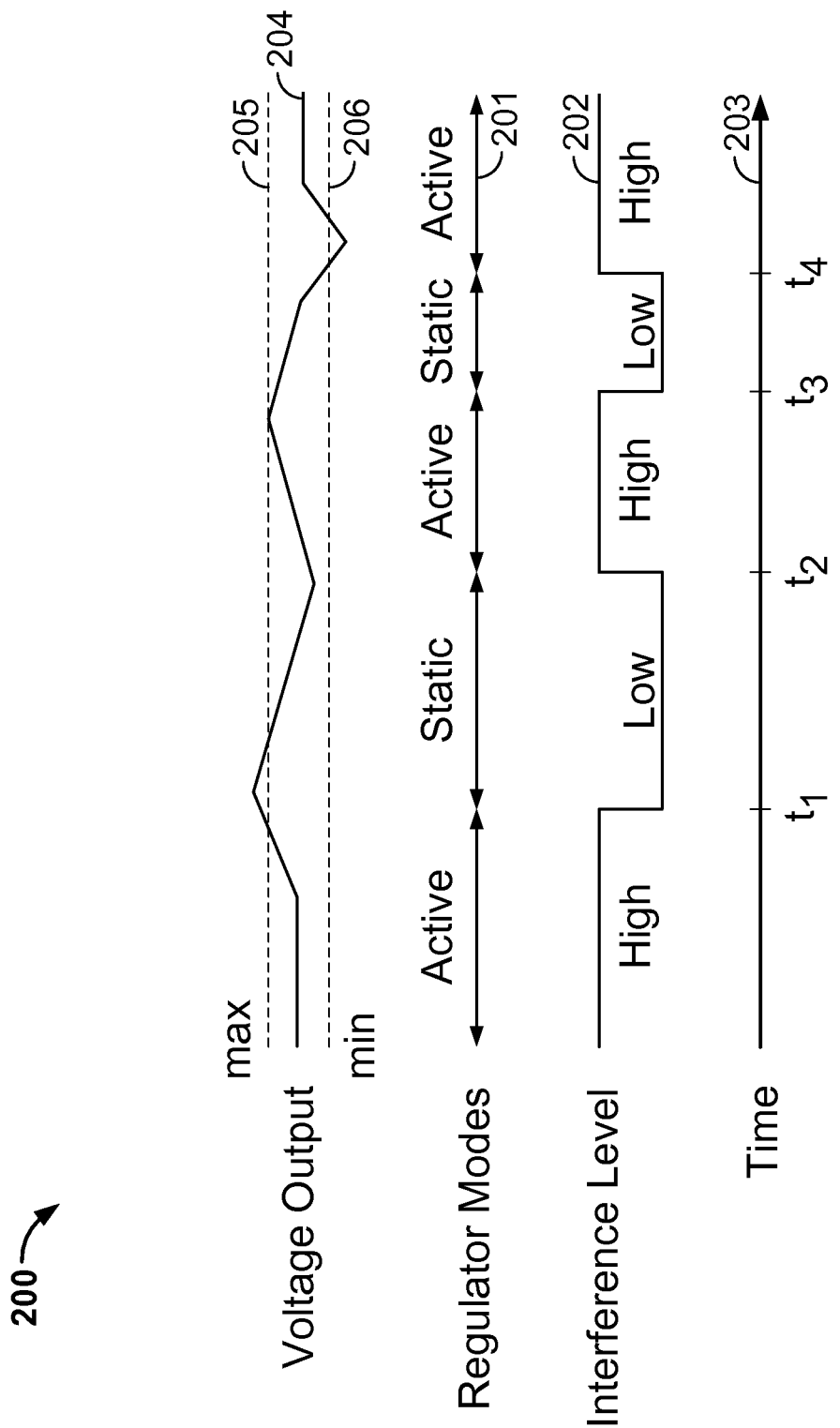
FIG. 2 is an example timing diagram of system functionality.

FIG. 2 shows an example timing diagram 200 of system functionality for a microcontroller system including, for example, the microcontroller of FIG. 1. A timeline 203 shows when events occur. In this example, the SRM 103 from FIG. 1 has two modes of operation, an "active" and a "static" mode. The SRM generates less interference while operating in static mode than in active mode. In other examples, the SRM can have more than two modes of operation. The regulator modes line 201 of the timing diagram shows which of the two modes the SRM operates in during various times. The interference level line 202 shows whether the SRM generates high or low levels of interference. The SRM generates a voltage output 204, e.g., by toggling a switch. The SRM maintains the voltage output between a maximum 205 and a minimum 206.

During the static mode of operation starting at time t1, the SRM generates a low amount of interference. However, during this time, the SRM cannot regulate the voltage output as effectively as it can during the active mode of operation. In this example, the voltage output decreases as a function of time when the SRM operates in static mode. The SRM can reduce the rate at which the voltage output decreases by releasing stored energy. The stored energy can be stored by a battery, capacitor, inductor, or various energy storage devices. At time t2, the SRM begins to operate in the active mode. Correspondingly, the SRM generates a high amount of interference, but the voltage output rises and stays within a regulated range.

At time t3, the SRM begins to operate in static mode again. It generates a low level of interference, but the voltage output falls. When the voltage output drops to the minimum level at t4, the SRM automatically switches back into the active mode. Various control circuitry can detect and force this change. If the ADC was performing a conversion operation starting at t3 while the SRM operated in static mode and the ADC was still in the process of performing the conversion operation at t4 when the SRM changed into active mode, the ADC's conversion result can be discarded, recalculated, or both. The ADC can alternatively stop the conversion process if the SRM switches back into the active mode during the conversion operation.

Example System

Figure 3:
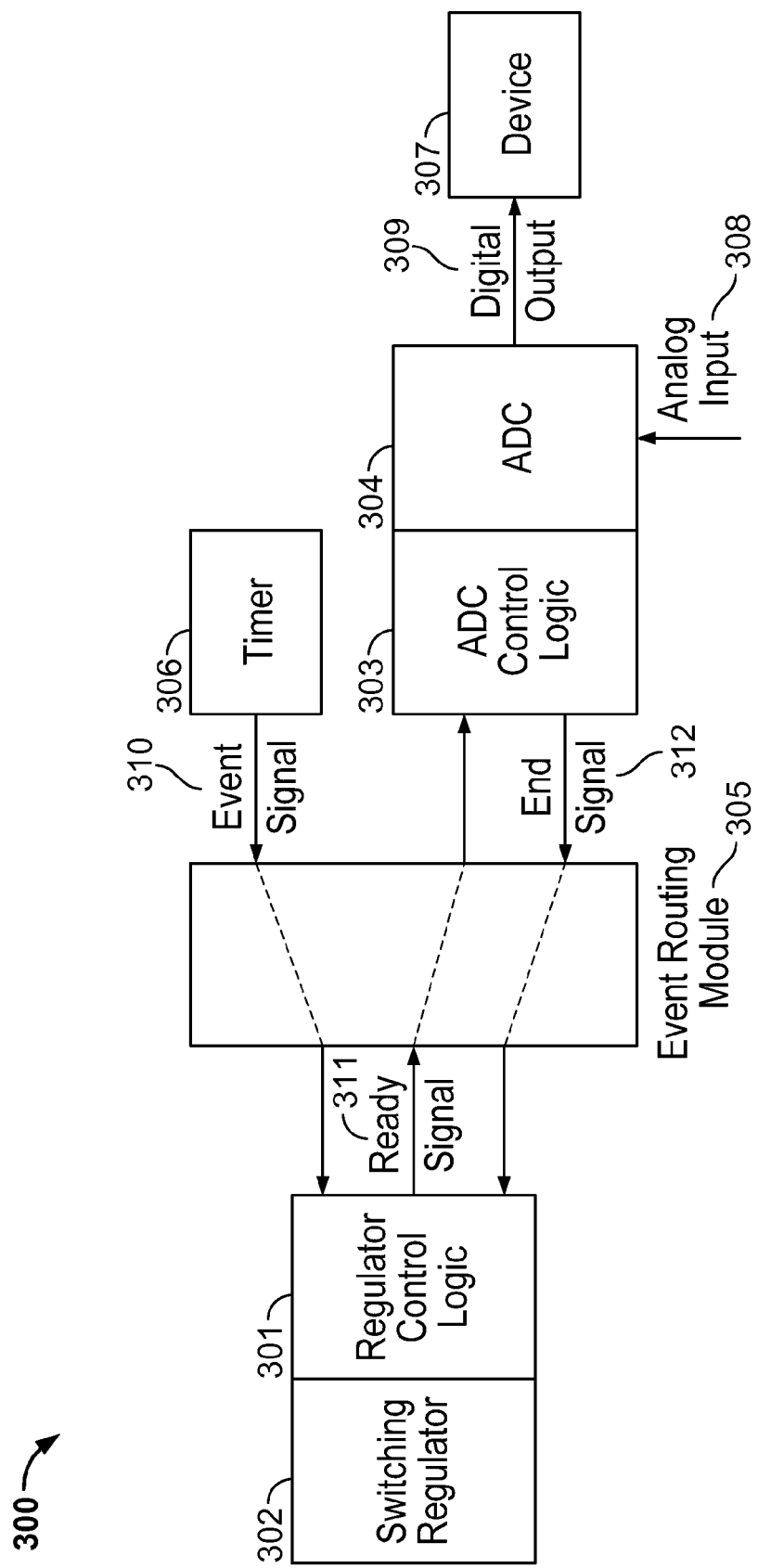
FIG. 3 is an example system showing connections between components.

FIG. 3 shows an example microcontroller system 300. A regulator control logic block 301 is coupled to a switching regulator module (SRM) 302. An ADC control logic block 303 is coupled to an ADC 304. The ADC is configured to receive an analog signal on an analog input line 308 and to generate a digital output signal on a digital output line 309. A device 307 reads the digital output signal on the digital output line. The device can be any component in the microcontroller or even a component external to the microcontroller. A timer module 306 is configured to send an event signal 310 to the regulator control logic. The timer module is shown for purposes of illustration, and a CPU or other component internal or external to the microcontroller can generate the event signal. The timer 306 can, in some cases, be the same component as the device 307. An event routing module 305 routes signals, including the event signal 310, the ready signal 311, and the end signal 312.

The regulator control logic block 301 controls the switching regulator module to change between active mode and static mode, and it also sends and receives signals. The ADC control logic block 303 controls the ADC to perform the conversion operation, and it also sends and receives signals.

At an initial point in operation, the SRM operates in an active mode and generates substantial interference. Due to the physical proximity of the ADC module to the SRM, the interference generated by the SRM can cause the ADC to generate an incorrect digital output signal for the respective analog input signal. To prevent this, the system operates the ADC while the SRM is in a static mode. In some implementations, the ADC operates continuously, but the device 307 does not read the output of the ADC while the SRM is in active mode because either the ADC output may be incorrect or because the device 307 is also located close enough to the SRM that the read operation of the device will also be affected by interference.

When the system does need to perform an ADC conversion, the event timer will send an event signal. The event routing module routes the event signal to the regulator control logic block 301. When the regulator control logic block 301 receives the event signal, it causes the SRM to operate in the static mode. After the SRM changes to the static mode, the regulator control logic block 301 sends a ready signal through the event routing module 305 to the ADC control logic block 303. In some implementations, the regulator control logic block 301 also causes the SRM to operate in the static mode while sending the ready signal.

When the ADC control logic receives the ready signal, it causes the ADC to perform the conversion operation. The ADC converts the analog input signal into a digital output signal, and the device 307 reads the digital output signal. When the conversion process is done, the ADC control logic block will send an end signal through the event routing module to the regulator control logic block. In some implementations, the ADC control logic block waits until the device has read the digital output signal before sending the end signal. When the regulator control logic block receives the end signal, it causes the SRM to operate in the active mode again.

Example Timing Diagram

Figure 4:
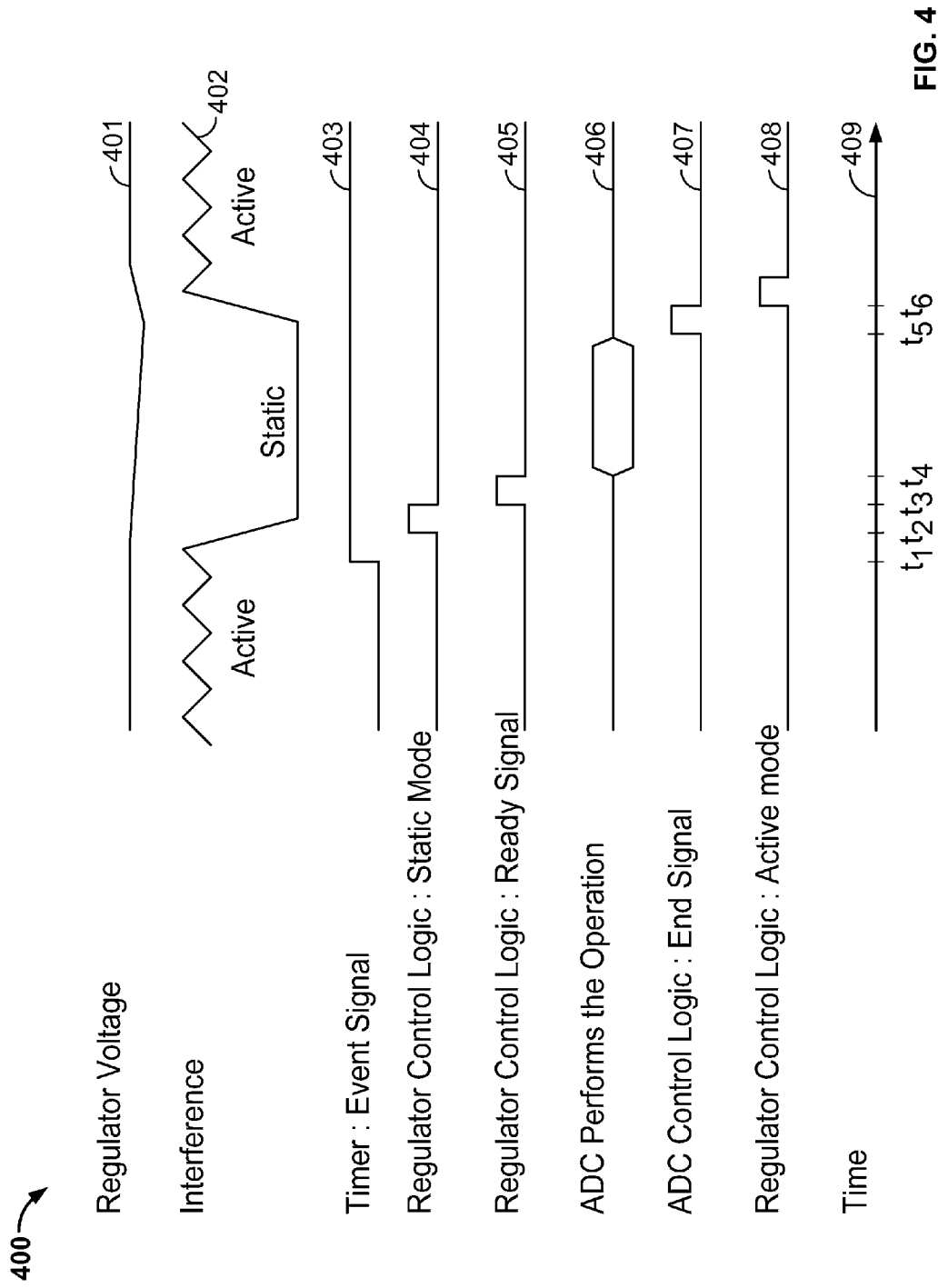
FIG. 4 is an example timing diagram of signals and functionality.

FIG. 4 shows an example timing diagram 400 of the signals and functionality of the system of FIG. 3. The Regulator Voltage line 401 shows the relative voltage level of the voltage signal that the switching regulator module helps to control. The interference line 402 shows the relative amounts of interference when the SRM operates in active and static mode. The Timer: Event signal line 403 shows when the timer has sent the event signal. The Regulator Control Logic: Static mode line 404 shows a signal issued from the Regulator Control Logic to the SRM to cause the SRM to operate in static mode. The Regulator Control Logic: Ready Signal line 405 shows the ready signal sent by the regulator control logic through the event routing module to the ADC control logic. The ADC Performs the Operation line 406 shows when the ADC converts the analog input signal into a digital output signal. The ADC: End Signal line 407 shows when the ADC control logic sends out the end signal through the event routing module. The Regulator Control Logic: Active mode line 408 shows when the regulator control logic instructs the SRM to resume operating in active mode. Timeline 409 shows the time progression with reference times t1-t6.

During initial operation before t1, the SRM operates in static mode with a high amount of interference, and the ADC does not perform any operation. At time t1, the timer generates an event signal. This event signal is shown for purposes of illustration as a digital high signal (a binary "1") that is held for the duration of the process, but it can be any appropriate type of signal, for example a digitally low signal (a binary "0"), a pulse or a toggled signal.

At time t2, the event signal reaches the regulator control logic block and the regulator control logic block causes the SRM to switch from the active to the static mode. The corresponding interference level 402 from time t2 to time t3 decreases. At time t3, the SRM has entered the static mode of operation, and the regulator control logic block sends the ready signal. When the ADC control logic block receives the ready signal at time t4, it causes the ADC to perform the operation. The operation takes until time t5 to complete, during which time the ADC converts the analog input signal into a digital output signal. In some implementations, the device 307 reads the digital output signal as part of performing the operation occurring during static mode. When performing the operation completes at time t5, the ADC control logic block sends the end signal through the event routing module. When the end signal reaches the regulator control logic block at time t6, the regulator control logic block sends an internal signal 408 to the SRM to resume operation in active mode, and the interference level is once again high.

Figure 5:
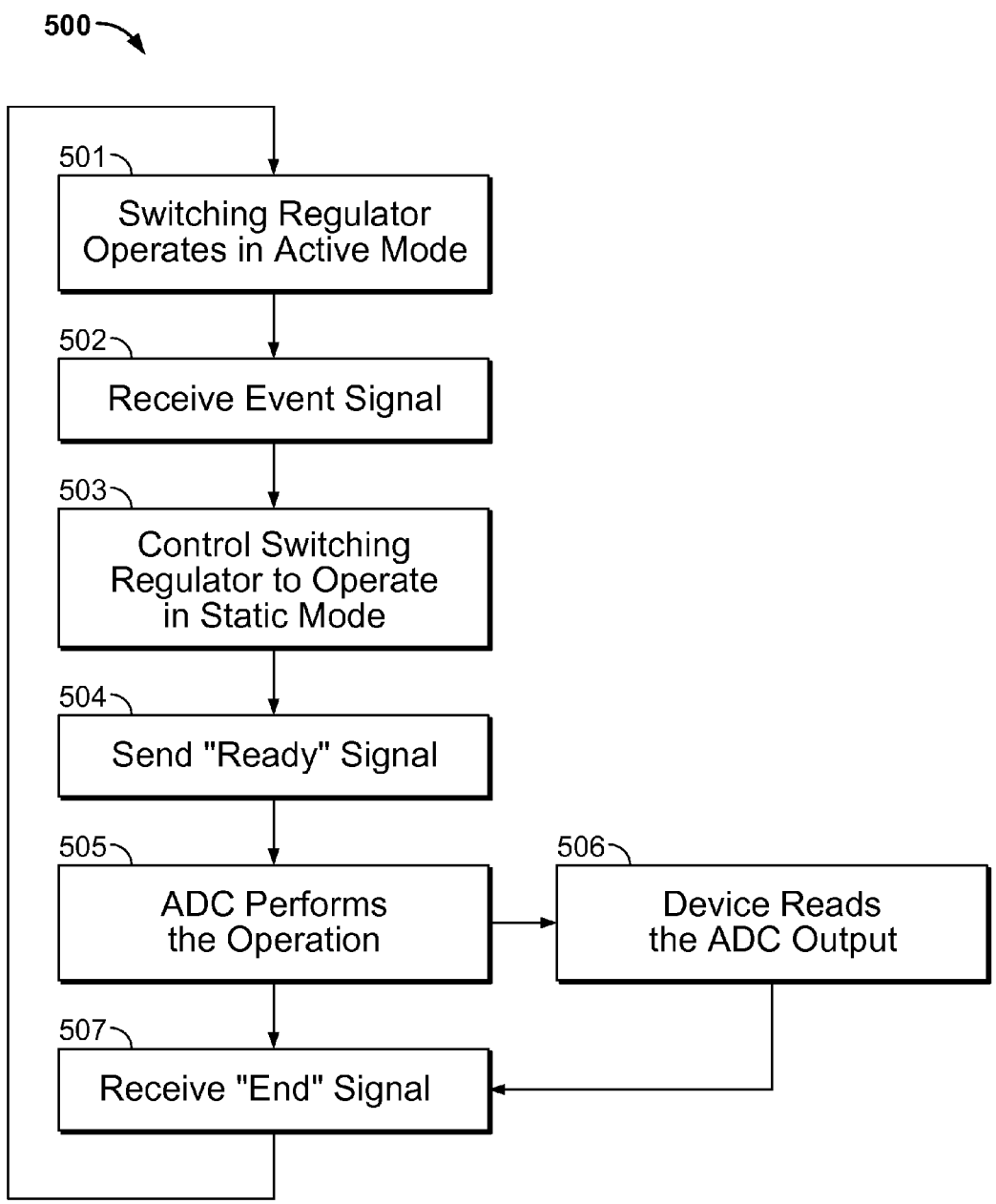
FIG. 5 is an example flowchart showing a control method.

FIG. 5 is a flow diagram of an example control method 500 performed by a control circuit for a switching regulator module (SRM). The control circuit can be the regulator control logic block 301 of FIG. 3.

The control circuit controls the SRM to operate in an active mode (501). The control circuit receives an event signal (502) and then, after receiving the event signal, controls the SRM to operate in a static mode (503). The control circuit then sends a ready signal through an event routing module to an ADC control logic block (504). The ADC control logic block causes an ADC to perform an operation to generate a digital output (505). A device optionally reads the digital output (506). When the ADC completes performing the operation, the control circuit receives an end signal through the event routing module sent by the ADC control logic block (507). The control circuit then causes the SRM to operate in the active mode (return to 501).

While this document contains many specific implementation details, these should not be construed as limitations on the scope what may be claimed, but rather as descriptions of features that may be specific to particular examples. For example, the individual components within the microcontroller may be different components, such as a digital to analog converter, an antenna, and an amplifier. One of the two components causing or receiving interference can reside external to the microcontroller. Certain features that are described in this specification in the context of separate examples can also be implemented in combination in a single implementation. Conversely, various features that are described in the context of a single example can also be implemented in multiple implementations separately or in any suitable sub combination. Moreover, although features may be described above as acting in certain combinations and even initially claimed as such, one or more features from a claimed combination can, in some cases, be excised from the combination, and the claimed combination may be directed to a sub combination or variation of a sub combination.

What is claimed is:

1. A microcontroller comprising:
  a first circuit module configured to operate in an active mode and a static mode;
  a first control circuit coupled to the first circuit module, the first control circuit configured to select between the active mode and the static mode for the first circuit module;
  a second circuit module configured to perform an operation susceptible to interference from the first circuit module when the first circuit module is operating in the active mode; and
  a second control circuit coupled to the second circuit module, the second control circuit configured to cause the second circuit module to perform the operation;
  wherein the first control circuit is configured to detect an event signal, select the static mode for the first circuit module, and propagate a ready signal;
  wherein the second control circuit is configured to detect the ready signal, perform the operation, and propagate an end signal after the second circuit module completes performance of the operation; and
  wherein the first control circuit is configured to detect the end signal and select the active mode of operation.

2. The microcontroller of claim 1, further comprising:
  a first control line coupled to the first control circuit, the first control line configured to propagate the event signal;
  a second control line coupled to the first control circuit and the second control circuit, the second control line configured to propagate the ready signal; and
  a third control line coupled to the first controller and the second controller, the third control line configured to propagate the end signal;
  an event routing module coupled to the first, second, and third control lines; and
  a timer module coupled to the event routing module and configured to generate the event signal.

3. The microcontroller of claim 2, further comprising:
  a fourth control line coupled to the first control circuit and to the event routing module, the fourth control line configured to propagate a force-event signal;
  a fifth control line coupled to the second control circuit and to the event routing module, the fifth control line configured to propagate a force-operate signal;
  wherein the first control circuit is configured to detect the force-event signal and to select the active mode of operation for the first circuit module; and
  wherein the second control circuit is configured to detect the force-operate signal and to cause the second circuit module to perform the operation.

4. The microcontroller of claim 1, further comprising a voltage signal line configured to conduct an electrical signal having a voltage value;
  wherein the first circuit module is a switching regulator comprising a switch and an energy storage device configured to store energy;
  wherein the switching regulator is configured to control the voltage value by actively toggling the switch when operating in the active mode; and
  wherein the switching regulator is configured to control the voltage value by releasing the energy stored in the energy storage device when operating in the static mode.

5. The microcontroller of claim 1, wherein the second circuit module is an analog to digital converter, and wherein the operation comprises converting an analog signal into one or more digital signals.

6. The microcontroller of claim 5, wherein the analog to digital converter is configured to save power when not performing the operation.

7. The microcontroller of claim 5, wherein the first circuit module is a switching regulator, and wherein the switching regulator is located within 200, 400, or 800 microns or closer to the analog to digital converter.

8. The microcontroller of claim 1, wherein the second circuit module is an analog to digital converter configured to continuously convert the analog signal into one or more digital signals, and wherein performing the operation comprises outputting the digital signal for reading.

9. A method performed by a first control circuit, the method comprising:
  receiving an event signal and controlling a first circuit module to switch from operating in an active mode to operating in a static mode;
  determining that the first circuit module is operating in the static mode and sending a ready signal to a second control circuit, thereby causing a second circuit module to perform an operation susceptible to interference from the first circuit module;
  receiving an end signal from the second control circuit; and
  controlling the first circuit module to switch from operating in the static mode to operating in the active mode after receiving the end signal.

10. The method of claim 9, further comprising:
  receiving, from a timer module, the event signal through an event routing module;
  sending the ready signal through the event routing module; and
  receiving the end signal through the event routing module.

11. The method of claim 9, further comprising:
  receiving a force-event signal and, as a consequence of receiving the force-event signal, controlling the first circuit module to switch from operating in the active mode to operating in the static mode.

12. The method of claim 9, wherein the first circuit module is a switching regulator, the method further comprising:
  regulating a voltage value through the switching regulator when the switching regulator is in the active mode; and
  maintaining the voltage value using an energy storage device when the voltage regulator is in static mode.

13. The method of claim 9, wherein the second circuit module is an analog to digital converter, the method further comprising controlling the analog to digital converter to perform the operation, wherein performing the operation comprises converting an analog signal into one or more digital signals.

14. The method of claim 9, wherein the second circuit module is an analog to digital converter, the method further comprising controlling the analog to digital converter to continuously convert an analog signal into one or more digital signals, wherein performing the operation comprises outputting the specific digital signals for reading.

15. The method of claim 9, wherein the first circuit module is a switching regulator, wherein the second circuit module is an analog to digital converter, and wherein the performing the operation comprises converting an analog signal into a digital signal, and wherein the switching regulator is located 200, 400, or 800 microns or closer to the analog to digital converter.

16. A system comprising:
an event routing module;
a timer module configured to generate a first event signal; and
a microcontroller comprising:
a first circuit module configured to operate in an active mode and a static mode;
a first control circuit coupled to the first circuit module, the first control circuit configured to select between the active mode and the static mode for the first circuit module;
a second circuit module configured to perform an operation susceptible to interference from the first circuit module when the first circuit module is operating in the active mode; and
a second control circuit coupled to the second circuit module, the second control circuit configured to cause the second circuit module to perform the operation;
wherein the first control circuit is configured to detect an event signal, select the static mode for the first circuit module, and propagate a ready signal;
wherein the second control circuit is configured to detect the ready signal, perform the operation, and propagate an end signal after the second circuit module completes performance of the operation; and
wherein the first control circuit is configured to detect the end signal and then select the active mode of operation.

17. The system of claim 16, wherein the timer and the event routing module are part of a microcontroller platform.

18. The system of claim 16, further comprising a voltage signal line configured to conduct an electrical signal having a voltage value;
wherein the first circuit module is a switching regulator comprising a switch and an energy storage device configured to store energy;
wherein the switching regulator is configured to control the voltage value by actively toggling the switch when operating in the active mode; and
wherein the switching regulator is configured to control the voltage value by releasing the energy stored in the energy storage device when operating in the static mode.

19. The system of claim 16, wherein the second circuit module is an analog to digital converter, wherein performing the operation comprises converting an analog signal into one or more digital signals.

20. The system of claim 16, wherein the first circuit module is a switching regulator, and wherein the switching regulator is located 200, 400, or 800 microns or closer to the analog to digital converter.

* * * * *